United States Patent
Krymski

(10) Patent No.: US 7,400,279 B2
(45) Date of Patent: Jul. 15, 2008

(54) CIRCUITS AND METHODS WITH COMPARATORS ALLOWING FOR OFFSET REDUCTION AND DECISION OPERATIONS

(75) Inventor: Alexander Krymski, 1028 N. Lake, Suite 204, Pasadena, CA (US) 91104

(73) Assignee: Alexander Krymski, Pasadena, CA (US)

( * ) Notice: Subject to any disclaimer, the term of this patent is extended or adjusted under 35 U.S.C. 154(b) by 0 days.

(21) Appl. No.: 11/777,905

(22) Filed: Jul. 13, 2007

(65) Prior Publication Data

US 2007/0257720 A1    Nov. 8, 2007

Related U.S. Application Data

(62) Division of application No. 11/303,420, filed on Dec. 16, 2005, now Pat. No. 7,336,214.

(51) Int. Cl.
*H03M 1/06* (2006.01)

(52) U.S. Cl. ............... 341/118; 341/136; 341/155; 327/54; 327/55; 327/67; 327/87

(58) Field of Classification Search .................. None
See application file for complete search history.

(56) References Cited

U.S. PATENT DOCUMENTS

| | | | |
|---|---|---|---|
| 4,129,863 A | | 12/1978 | Gray et al. |
| 4,200,863 A | | 4/1980 | Hodges et al. |
| 4,490,682 A | | 12/1984 | Poulo |
| 4,883,987 A | * | 11/1989 | Fattaruso ..................... 327/65 |
| 5,065,045 A | * | 11/1991 | Mok ........................... 327/63 |
| 5,113,090 A | * | 5/1992 | Imaizumi et al. .............. 327/69 |
| 5,235,333 A | * | 8/1993 | Naylor et al. ................ 341/118 |
| 5,272,395 A | * | 12/1993 | Vincelette ..................... 327/63 |
| 5,565,800 A | * | 10/1996 | Kobayashi .................... 327/65 |
| 5,589,785 A | * | 12/1996 | Garavan ........................ 327/63 |
| 5,600,275 A | * | 2/1997 | Garavan ........................ 327/307 |
| 5,793,322 A | | 8/1998 | Fossum et al. |
| 5,831,562 A | * | 11/1998 | Van Auken et al. ........... 341/122 |
| 5,841,126 A | | 11/1998 | Fossum et al. |

(Continued)

OTHER PUBLICATIONS

Phillip E. Allen and Douglas R. Holberg, CMOS Analog Circuit Design, published by Oxford University Press, Inc., 2002, pp. 484-485, no month.

(Continued)

*Primary Examiner*—Khai M Nguyen
(74) *Attorney, Agent, or Firm*—Foley & Lardner LLP

(57) ABSTRACT

Circuits and methods may be improved by using ADCs that compensate for the effect of comparator input offset on comparator decisions. Offset compensation may be implemented in an ADC by using an amplifier section between the input of the ADC and a comparator section of the ADC to amplify the signals supplied to the comparator inputs and thereby reduce the effect of comparator offset on the comparator decision. The comparator section may be an autozeroing comparator section that is capable of performing an offset reduction operation to store offset compensation values at capacitors provided at its inputs. The amplifier section may be an autozeroing amplifier section having one or more amplifier stages that are capable of performing an offset reduction operation to store offset compensation values at capacitors provided at their inputs. Offset compensation may also be implemented using an autozeroing comparator section without a preceding amplifier section.

25 Claims, 8 Drawing Sheets

U.S. PATENT DOCUMENTS

| | | |
|---|---|---|
| 5,880,691 A | 3/1999 | Fossum et al. |
| 6,124,819 A | 9/2000 | Zhou et al. |
| 6,215,333 B1 * | 4/2001 | Kuttner .................. 327/67 |
| 6,392,449 B1 * | 5/2002 | Taft ...................... 327/55 |
| 6,396,430 B1 | 5/2002 | Li |
| 6,429,697 B1 * | 8/2002 | Amazeen et al. ........ 327/87 |
| 6,441,357 B2 | 8/2002 | Ang et al. |
| 6,567,028 B2 | 5/2003 | Huang et al. |
| 6,881,942 B2 | 4/2005 | Huang et al. |
| 6,885,396 B1 | 4/2005 | Panicacci et al. |
| 7,068,319 B2 | 6/2006 | Barna et al. |
| 2004/0041080 A1 | 3/2004 | Barna et al. |
| 2004/0051802 A1 | 3/2004 | Krymski |
| 2004/0246030 A1 * | 12/2004 | Yang ..................... 327/58 |
| 2006/0001753 A1 | 1/2006 | Funakoshi et al. |

OTHER PUBLICATIONS

PCT Search Report, PCT application No. PCT/US06/48102 dated Feb. 25, 2008.

* cited by examiner

CIRCUITS AND METHODS WITH COMPARATORS ALLOWING FOR OFFSET REDUCTION AND DECISION OPERATIONS

CROSS-REFERENCE TO RELATED PATENT APPLICATIONS

This application is a divisional application of U.S. patent application Ser. No. 11/303,420, filed Dec. 16, 2005, entitled "Analog to Digital Converter Circuit with Offset Reduction and Image Sensor Using the Same", the contents of which are incorporated by reference herein.

BACKGROUND

1. Field of the Invention

The present invention relates to CMOS image sensors.

2. Related Technology

CMOS image sensors have wide application in consumer and industrial electronics. In general terms, CMOS image sensors are comprised of rows of pixels that supply analog pixel values. The analog pixel signals are read out row by row and converted to digital values. While consumer CMOS image sensor chips typically include only one or two analog to digital converters (ADCs), high speed CMOS image sensors utilize one ADC per column, or per several columns.

A simplified architecture of a conventional high speed CMOS image sensor is illustrated in FIG. 1. The image sensor includes a pixel array comprised of rows of pixel circuits 10. A row control signal supplied by a row decoder/driver 12 controls the operations performed by the pixel circuits in each row. Pixel circuits aligned in the same column share a common readout line 14. Signals from the pixel circuits are buffered or amplified by column readout circuits 16, digitized by ADCs 18, and stored in a static or dynamic RAM 20 that typically has parallel inputs and a serial output. The operation of the ADCs and the memory are controlled by a controller 22. Signals read from memory are amplified by sense amps 24 and supplied to buffers 26 that drive the signals to I/O pads.

Details of an ADC that may be used in the circuit of FIG. 1 are illustrated in FIG. 2. The output signal of a pixel circuit is supplied to an input 30 of the ADC by a buffer or amplifier. A reset capacitor 32 samples and holds a reset value received from the pixel circuit through a switch 34 responsive to a control signal SHR, thus providing a reset voltage at a first input node 36 of a comparator 38. A binary scaled sampling capacitor bank 40 samples and holds a pixel signal value received from the pixel circuit through a switch 38 responsive to a control signal SHS, thus providing a signal voltage at a second input node 42 of the comparator 38. Although not shown in FIG. 2, respective calibration circuits may be used to apply calibration values to the input nodes 36, 42, for example to provide black level calibration.

Conversion latches 44 control the application of reference values to the sampling capacitors 40, thus changing the voltage seen by the comparator 38 at the second input node 42. A binary scaled calibration capacitor bank 46 can also sample and hold a value from the input 30 of the ADC. Calibration latches 48 control the application of reference values to the capacitors of the calibration capacitor bank 46. The output 50 of the comparator is fed back to the conversion latches 44 and calibration latches 48.

In operation, a voltage corresponding to the pixel reset value is sampled and held at the first input node 36, and a voltage corresponding to the pixel signal is sampled and held at the second input node 42. The conversion latches 44 maintain a low ADC reference voltage on the bottom plates of the sampling capacitors 40 during sampling of the pixel signal. After the pixel signal is sampled, logic associated with the conversion latches 44 causes high voltages to be applied sequentially to the bottom plates of the capacitors in the sampling capacitor bank 40. Initially a high ADC reference voltage is applied to the bottom plate of the largest capacitor in the sampling capacitor bank 40. The resulting potential at the second input node 42 is compared to the reset value at the first input node 36 to generate a comparator 38 output value. If the potential at the second input node 42 is greater than the potential at the first input node 36, the comparator 38 output goes to 0 and the bottom plate of the capacitor is reset to low reference. Conversely, if the potential at the second input node 42 is less than the potential at the first input node 36, the comparator output goes to 1 and the bottom plate of the capacitor is maintained at high reference. The comparator output value generated by this comparison is the most significant bit of a binary word representing the value of the pixel signal sampled at the second input node 42. This process is repeated for all of the capacitors in the sampling capacitor bank 40 in order of decreasing size. The resulting string of comparator output values is a binary word representing the value of the pixel signal.

The high speed dynamic comparator 38 typically has some inherent offset between its inputs arising from the nonideal components of the comparator. The exact offset is individual for each ADC and therefore varies from column to column, producing artifacts in the sampled image. To compensate these offsets, a calibration procedure is performed in the ADC prior to operation using the calibration latches 48 and the calibration capacitor bank 46. The size of the capacitors in the calibration capacitor bank 46 can be smaller than those of the sampling capacitor bank 40 because the comparator offset is typically less than 10% of the full ADC range. The calibration procedure is performed using the offset value of the comparator as the sampled signal and results in settings of static memories associated with the individual calibration latches 48 that compensate the offset by selectively charging the capacitors of the calibration capacitor bank 46. The calibration procedure may be performed on power-up.

While this circuit can reduce ADC offset, the offset is typically not removed completely, and so column-to-column nonuniformity of ADCs remains. Further, in ADC circuits of the type illustrated in FIG. 2, the calibration capacitor bank 46 and calibration latches 48 may occupy up to 40% of the circuit area. This is an undesirable amount of space to devote to the calibration portion of the circuit

SUMMARY

An image sensor may be improved by using ADCs that compensate for the effect of comparator input offset on comparator decisions. Offset compensation may be implemented in an ADC by using an amplifier section between the input of the ADC and a comparator section of the ADC to amplify the signals supplied to the comparator inputs and thereby reduce the effect of comparator offset on the comparator decision. The comparator section may be an autozeroing comparator section that is capable of performing an offset reduction operation to store offset compensation values at capacitors provided at its inputs. The amplifier section may be an autozeroing amplifier section having one or more amplifier stages that are capable of performing an offset reduction operation to store offset compensation values at capacitors provided at their inputs. Offset compensation may also be implemented using an autozeroing comparator section without a preceding amplifier section. Embodiments of the invention include methods of operation of such circuits.

DETAILED DESCRIPTION

Figure 2:
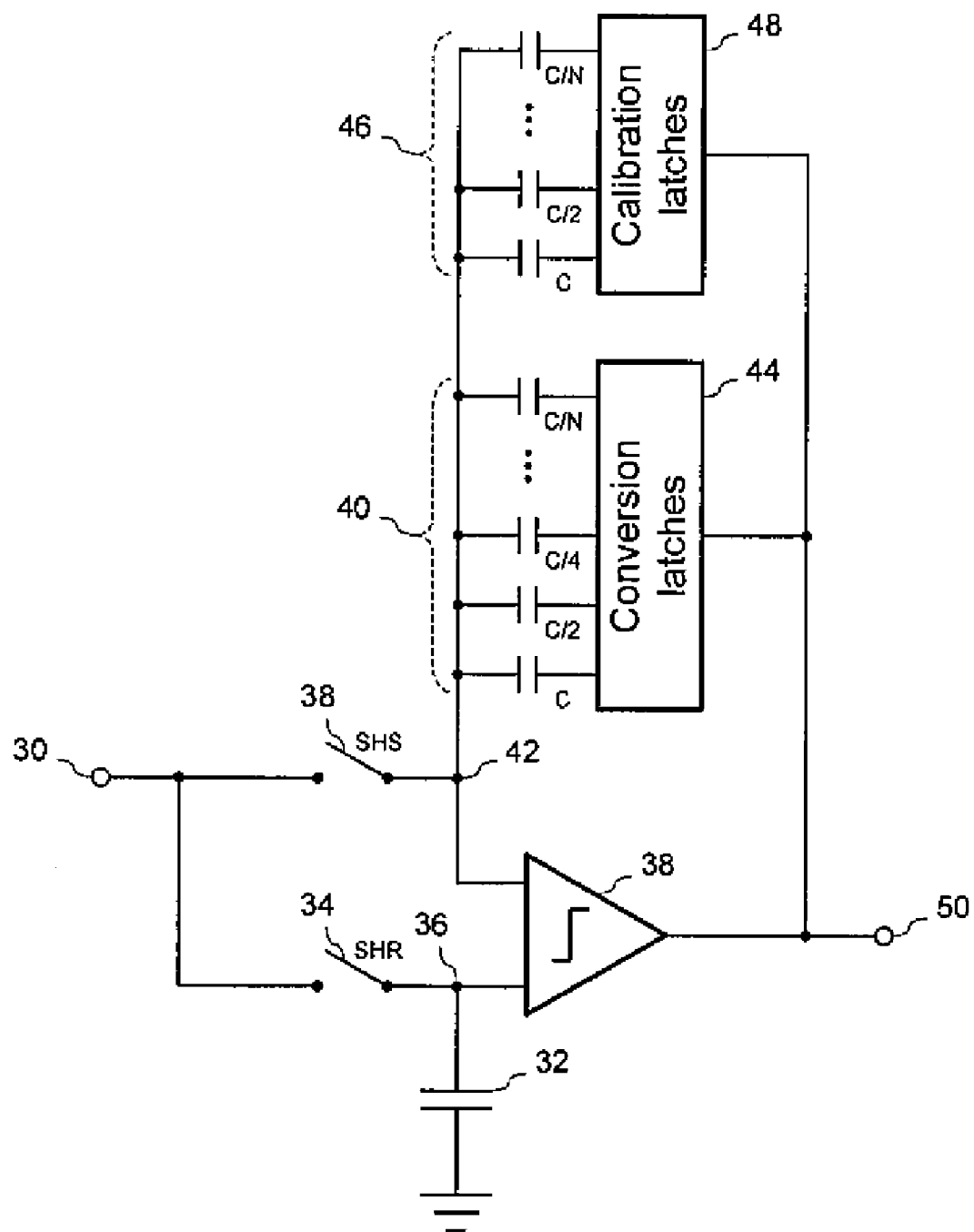
FIG. 2 shows a conventional analog to digital converter (ADC) circuit used in a CMOS image sensor.
Figure 3:
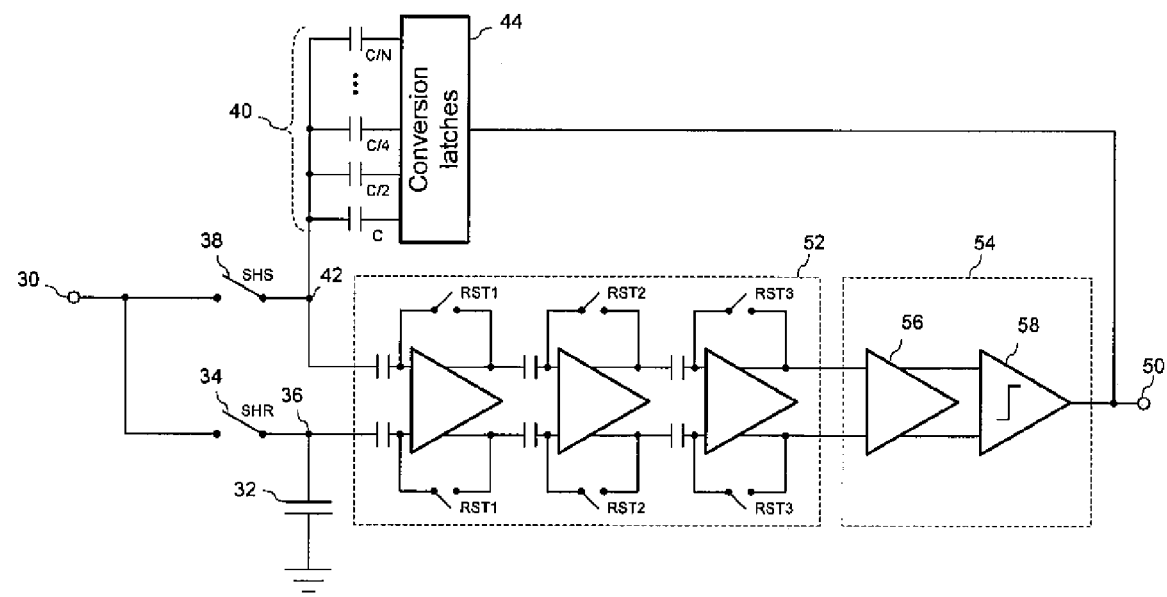
FIG. 3 shows a first ADC circuit capable of performing an offset reduction operation.

FIG. 3 shows an ADC circuit that may be used for analog to digital conversion of pixel signals in a CMOS image sensor. The ADC circuit of FIG. 3 is similar to the ADC circuit of FIG. 2 in that it includes a reset capacitor 32 for storing a reset value received through a switch 34 responsive to a control signal SHR at a first input node 36, a binary scaled sampling capacitor bank 40 for storing a pixel value received through a switch 38 responsive to a control signal SHS at a second input node 42, and conversion latches 44 that control the application of an ADC reference value to the sampling capacitors 40. Although not shown in FIG. 3, respective calibration circuits may be used to apply calibration values to the input nodes 36, 42, for example to provide black level calibration.

The signals stored at the first input node 36 and the second input node 42 are received at the inputs of an autozeroing amplifier section 52, which in turn provides its outputs to an autozeroing comparator section 54 comprised of a buffer 56 and an autozeroing comparator 58. The buffer 56 of the autozeroing comparator section 54 stabilizes input voltages supplied to the autozeroing comparator 58 and reduces the effect of comparator kick-back on the autozeroing comparator's low capacitance input nodes.

As described below, the autozeroing amplifier section 52 is preferably comprised of multiple amplifier stages. FIG. 3 shows the autozeroing amplifier section 52 as being comprised of three amplifier stages. In a preferred embodiment, each amplifier stage is a low gain amplifier having, for example, a gain of approximately 7. Using such amplifier stages, a three stage autozeroing amplifier section 52 such as the one illustrated in FIG. 3 has a total gain of approximately 343. Amplification of the input signals prior to supplying them to the autozeroing comparator section 54 increases the ratio of the signal magnitudes to the comparator input offset, and thus effectively decreases the influence of the comparator input offset on the comparator decision.

Each stages of the autozeroing amplifier section 52 is preferably an autozeroing amplifier that is capable of performing an offset reduction operation to compensate for offset between its inputs. For purposes of this disclosure, the offset reduction operation may also be referred to as autozeroing. The amplifier stages of the autozeroing amplifier section 52 of FIG. 3 perform offset reduction operations in response to respective reset signals RST1, RST2 and RST3.

The autozeroing amplifier section 52 may alternatively be comprised of as few as one autozeroing amplifier stage, or two or more autozeroing amplifier stages, as the particular implementation warrants. Although not shown in FIG. 3, it is preferable to provide several inverters in the signal path between the autozeroing comparator section output 50 and the conversion latches 44 to improve the quality of the signal supplied to the conversion latches 44.

Figure 4:
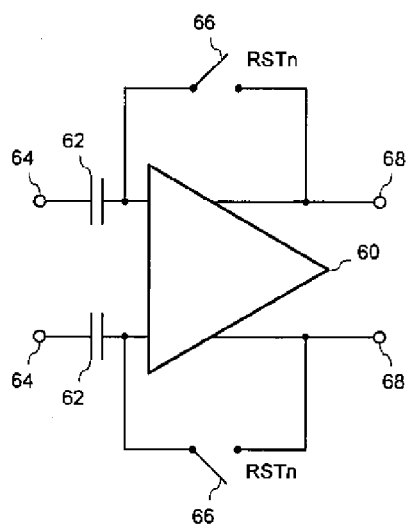
FIG. 4 shows details of a stage of an autozeroing amplifier stage that may be used in the ADC circuit of FIG. 3.

FIG. 4 shows a stage of the autozeroing amplifier section 52 in greater detail. The stage is comprised of a low gain amplifier 60 having input capacitors 62 at respective inputs 64. Reset switches 66 operate in response to a reset signal RSTn to short the respective inputs 64 to the corresponding outputs 68 to reduce offset between the inputs of the amplifier stage. Offset reduction occurs when the reset switches are closed, causing the respective input offset voltages to be stored in the corresponding input capacitors.

Figure 5:
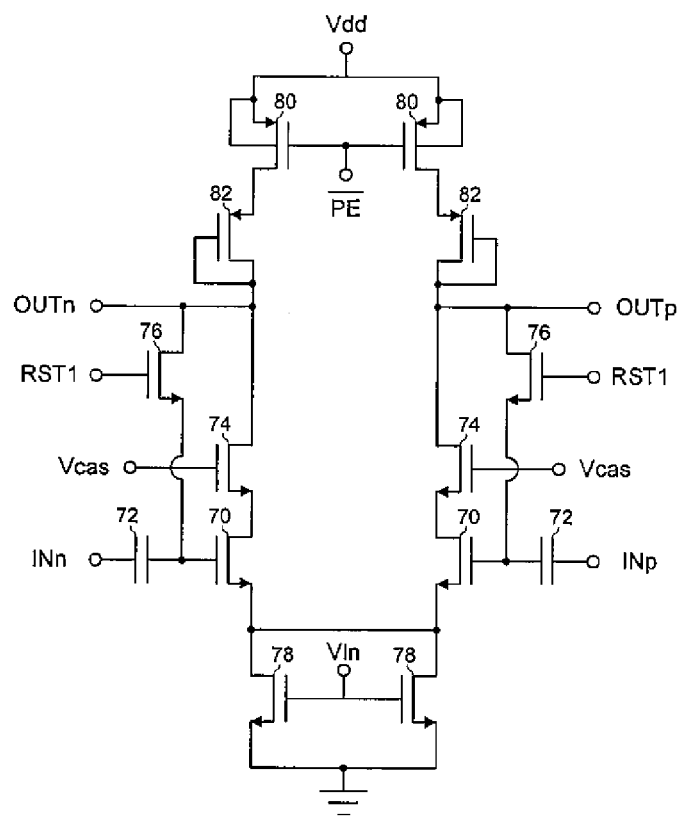
FIG. 5 shows a circuit level schematic of the amplifier stage of FIG. 4.
Figure 6:
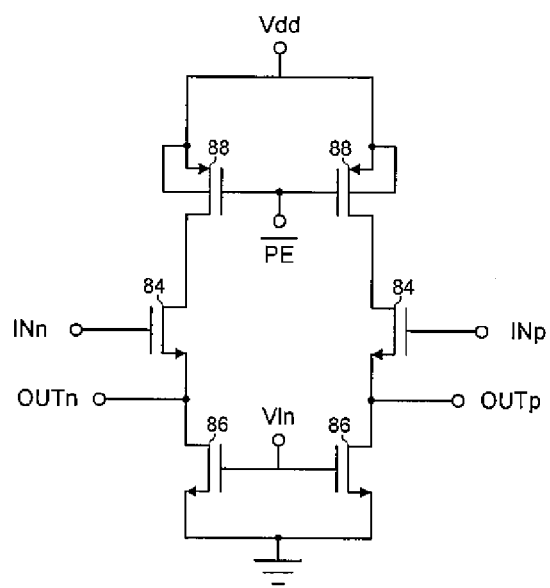
FIG. 6 shows a circuit level schematic of a buffer that may be used in the ADC circuit of FIG. 3.
Figure 7:
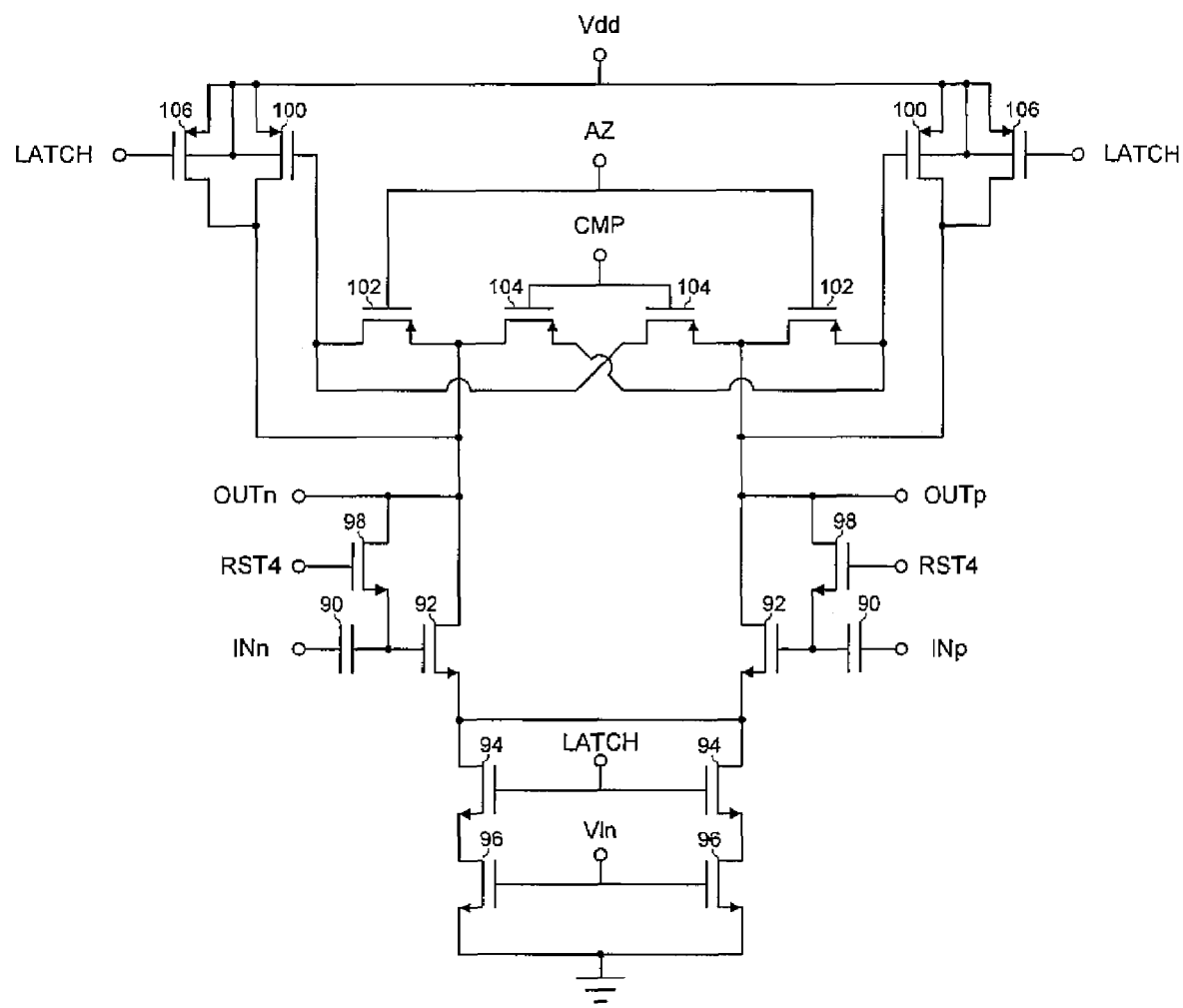
FIG. 7 shows a circuit level schematic of an autozeroing comparator that may be used in the ADC circuit of FIG. 3.

FIGS. 5, 6 and 7 show circuit level schematics of portions of the circuit of FIG. 3. These circuits use symmetrical arrangements of MOSFETs in which corresponding MOSFETs are preferably matched. Unless otherwise shown, the bodies of MOSFETs illustrated in FIGS. 5-7 are connected to ground.

FIG. 5 shows a circuit level schematic of a low gain autozeroing amplifier that is preferably used as the autozeroing amplifier stage of FIG. 4. The amplifier is a cascoded resetable differential amplifier with diode-connected loads. The amplifier is comprised of inputs nodes INn, INp for supplying input signals to the gates of NMOS input transistors 70 via input capacitors 72. NMOS cascode transistors 74 are provided in series with the NMOS input transistors 70 and are supplied at their gates with a bias voltage Vcas. NMOS reset transistors 76 are coupled between the input nodes INn, INp and the output nodes OUTn, OUTp and serve as switches for shorting the input nodes INn, INp to the output nodes OUTn, OUTp to perform the offset reduction operation. NMOS bias transistors 78 control a bias current in response to a gate signal VIn. Supply of power Vdd to the amplifier circuit is controlled by supply transistors 80 in response to a power enable signal PE-bar. PMOS load transistors 82 are diode connected between Vdd and the output nodes OUTn, OUTp. Application of the control signal RST1 to the gates of the NMOS reset transistors 76 causes the respective amplifier input nodes INn, INp to be shorted to their corresponding output nodes OUTn, OUTp such that OUTn=INn and OUTp=INp. This drives the amplifier to a virtual ground state in which the voltages at the gates of the input transistors 70 settle at their respective reset values which include their input threshold values plus potential drops in the channels of the input transistor 70 due to the amplifier current. The difference between these reset values is the inherent offset of the amplifier stage. The reset values are stored in the respective input capacitors 72, thus effectively removing those values from the input values received by the amplifier when the amplifier is returned to the amplifying state, and thus significantly reducing offset in the amplifier stage.

FIG. 6 shows a circuit level schematic of a buffer circuit that is preferably used as the buffer 56 of the autozeroing comparator section 54 of the ADC circuit of FIG. 3. The buffer is a simple amplifier comprised of NMOS source follower transistors 84 that receive signals from input nodes INn, INp at their gates and drive output nodes OUTn, OUTp. Bias transistors 86 control a bias current in response to a gate signal VIn. Supply of power Vdd to the amplifier circuit is controlled by supply transistors 88 in response to a power enable signal PE-bar.

FIG. 7 shows a circuit level schematic of a comparator that is preferably used as the autozeroing comparator 58 in the autozeroing comparator section 54 of the ADC circuit of FIG. 3. Input nodes INn, INp receive input signals that are supplied through input capacitors 90 to the respective gates of a differential pair of NMOS input transistors 92. The NMOS input transistors 92 drive output nodes OUTn, OUTp. Coupled in series between the NMOS input transistors 92 and ground are NMOS current enable transistors 94 and NMOS bias transistors 96. The NMOS current enable transistors 94 enable current flow through the differential pair of NMOS input transistors 92 in response to a LATCH control signal supplied to their gates. The NMOS bias transistors 96 control a bias current in response to a bias control signal VIn supplied to their gates. NMOS reset transistors 98 are coupled between the respective output nodes OUTn, OUTp and their corresponding input nodes INn, INp to perform an offset reduction operation in response to a reset signal RST4 applied to their gates.

Coupled between the output nodes OUTn, OUTp and a voltage source Vdd are PMOS load transistors 100. The gates of the PMOS load transistors 100 are coupled to their drains through respective PMOS autozero enable transistors 102. The PMOS autozero enable transistors 102 receive an autozero control signal AZ at their gates. The gates of the PMOS load transistors 100 are also cross-coupled to opposing output nodes OUTn, OUTp through respective PMOS comparator enable transistors 104. The PMOS comparator enable transistors 104 receive a comparator control signal CMP at their gates. Also coupled between the output nodes OUTn, OUTp and the voltage source Vdd are PMOS preset transistors 106. The PMOS preset transistors 106 receive the LATCH control signal at their gates.

Three states of the comparator circuit of FIG. 7 are relevant to the operation of that circuit in the ADC circuit of FIG. 3: an offset reduction state, a preset state, and a decision state.

In the offset reduction state, a LO autozero control signal AZ is applied to the gates of the PMOS autozero enable transistors 102, which configures the PMOS autozero enable transistors 102 as diode connected loads between Vdd the output nodes OUTn, OUTp and causes the circuit to operate as an autozeroing low gain amplifier. A HI comparator control signal CMP is applied to the PMOS comparator enable transistors 104, which disconnects the gates of the PMOS load transistors 100 from the opposing output nodes OUTn, OUTp. A HI LATCH control signal is applied to the gates of the PMOS preset transistors 106 and the NMOS current enable transistors 94. This enables current flow through the NMOS current enable transistors 94 and thus through the differential pair of NMOS input transistors 92, while also disabling the PMOS preset transistors 106. In this state the circuit operates as a low gain amplifier similar to the amplifier circuit illustrated in FIG. 5. Application of a reset signal RST4 to the gates of the NMOS reset transistors 98 during this state couples the circuit outputs OUTn, OUTp to the gates of the corresponding input transistors 92, thus performing an offset reduction operation similar to the circuit of FIG. 5. This substantially reduces any offset that could affect the decision of the circuit in the decision state.

In the preset state, a LO LATCH control signal is applied to the gates of the PMOS preset transistors 106 and the NMOS current enable transistors 94. This disables current flow through the NMOS current enable transistors 94 and thus through the NMOS input transistors 92, while also enabling current flow through the PMOS preset transistors 106 to the output nodes OUTn, OUTp. This causes the output nodes OUTn, OUTp to be charged to Vdd. While a LO comparator control signal CMP is typically applied to the PMOS comparator enable transistors 104 during this state, this has essentially no effect on the charging of the output nodes.

In the decision state, a LO comparator control signal CMP is applied to the PMOS comparator enable transistors 104, thereby shorting the gates of the PMOS load transistors 100 to the opposing output nodes OUTn, OUTp. Consequently current flow from Vdd through each of the PMOS load transistors 100 to its corresponding output node OUTn, OUTp is controlled by the value at the opposing output node. A HI autozero control signal AZ is applied to the gates of the PMOS autozero enable transistors 102 to disconnect the PMOS autozero enable transistors 102. A HI LATCH control signal is applied to the gates of the PMOS preset transistors 106 and the NMOS current enable transistors 94. This enables current flow through the NMOS current enable transistors 94 and thus through the NMOS input transistors 92, while also disabling current flow through the PMOS preset transistors 106.

An example of operation in the decision state is now given using the condition in which the input INn receives a higher input voltage and the input INp receives a lower input voltage. When the circuit enters the decision state, the output nodes OUTn, OUTp are precharged to Vdd, and the input voltages are applied to the gates of the NMOS input transistors 92. The NMOS input transistor 100 that receives the higher input voltage from INn will allow relatively more current to discharge from its corresponding output node OUTn toward ground, while the opposing NMOS input transistor 100 that receives the lower input voltage from INp will allow relatively less current to discharge from its corresponding output node OUTp toward ground. The enhanced current flow from OUTn toward ground reduces the voltage at the output node OUTn, which in turn reduces the voltage applied to the gate of the opposing PMOS load transistor 100, thus enhancing current flow from Vdd to OUTp. At the same time, the relatively lower discharge from OUTp toward ground results in a relatively higher voltage at the output node OUTp, thereby keeping the opposing PMOS load transistor 100 closed and restricting current flow from Vdd to the output node OUTn. Through this mechanism, a self-reinforcing decision operation is performed wherein the higher input signal at INn drives the corresponding output node OUTn to ground, while the lower input signal INp drives the corresponding output node OUTp to Vdd.

Figure 1:
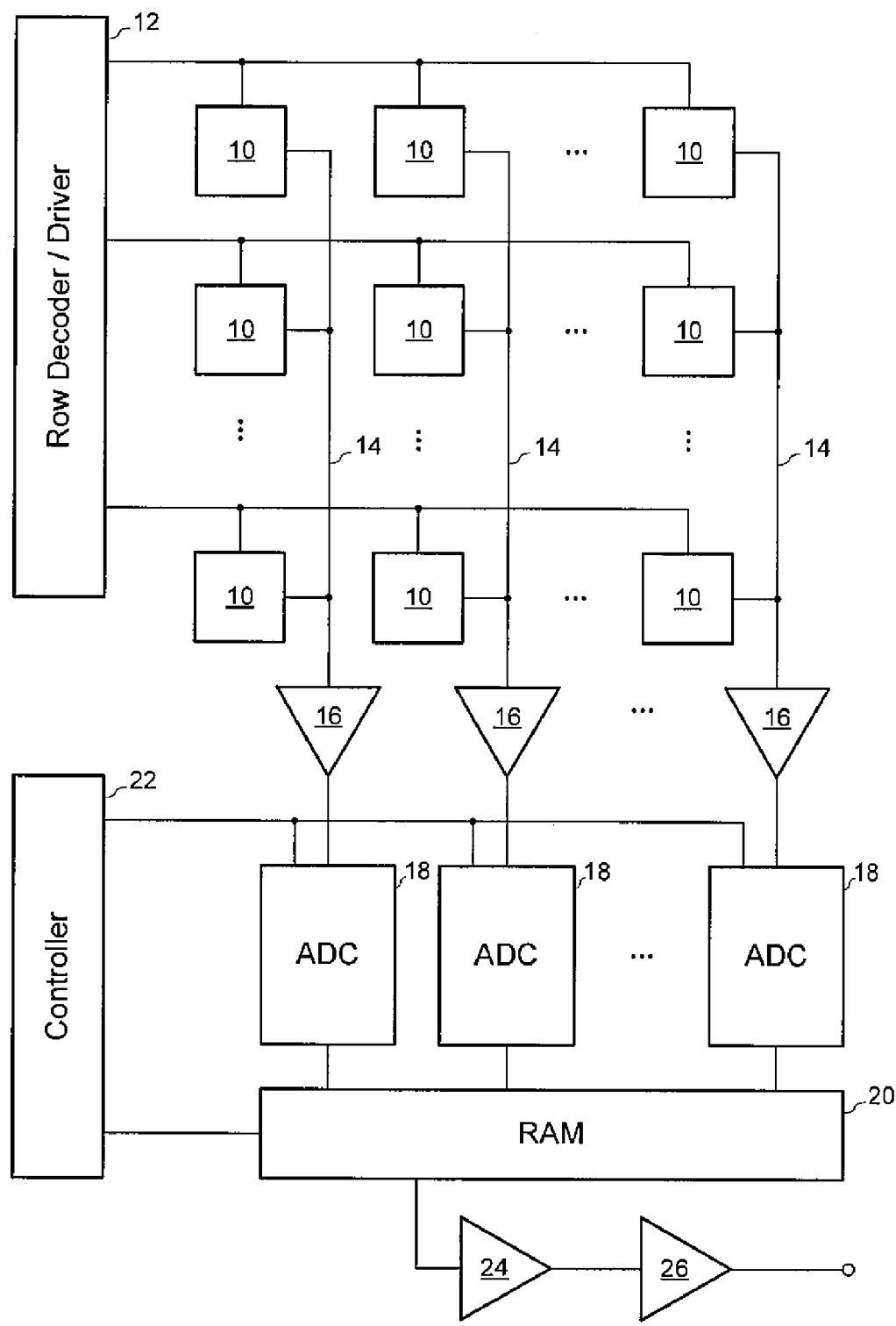
FIG. 1 shows a conventional architecture of a high speed CMOS image sensor with a column-parallel ADC architecture.
Figure 8:
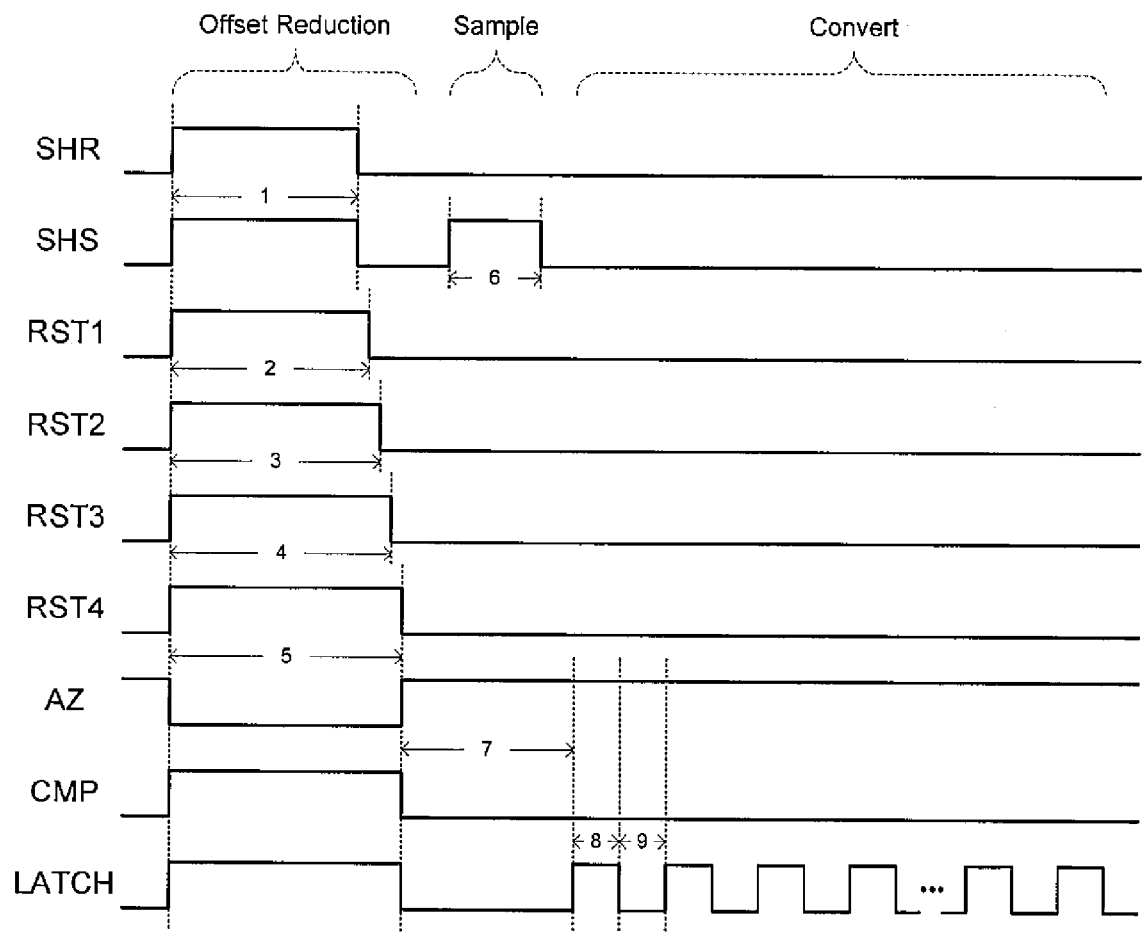
FIG. 8 shows a timing diagram for the ADC circuit of FIG. 3.

The ADC circuit of FIG. 3 may be used in an image sensor circuit such as the circuit illustrated in FIG. 1. The controller 22 of the image sensor circuit provides control signals to the autozeroing amplifier section 52 and the autozeroing comparator section 54 to control the operation of the ADC circuit. FIG. 8 provides a timing diagram for control signals provided by a controller to the ADC circuit of FIG. 3 using a three-stage autozeroing amplifier section 52 having stages of the type shown in FIG. 5 and an autozeroing comparator section 54 having a buffer and an autozeroing comparator as shown in FIGS. 6 and 7. The operation of the circuit generally includes an offset reduction phase, a sampling phase and a conversion phase. FIG. 8 shows the states of control signals applied to the circuits during each of these phases.

During the offset reduction phase, the sampling control signals SHR and SHS, the amplifier stage reset signals RST1, RST2 and RST3, the comparator reset signal RST4 and the comparator autozero enable signal AZ are all enabled to cause offset reduction operations to be performed in the respective amplifier and comparator circuits. These signals are enabled during an initial period 1. Also during period 1, the pixel reset value is applied to the input 30 of the ADC circuit, causing the pixel reset value to be sampled to the first input node 36. SHR and SHS are disabled at the end of period 1, RST1 is disabled at the end of period 2, RST2 is disabled at the end of period 3, RST3 is disabled at the end of period 4, and RST4 and AZ are disabled at the end of period 5. This series of steps enables each sequential stage to perform offset reduction individually with minimal influence from upstream stages. During the course of period 5, LATCH is HI to enable the offset reduction operation. CMP is typically the inverse of AZ at all times.

During the sampling phase, a pixel signal value is applied to the input 30 of the ADC circuit, causing the pixel signal value to be sampled onto the second input node 42 of the first amplifier stage in response to control signal SHS during period 6. During an overlapping period 7, AZ is set to HI to disable the comparator offset reduction operation, while LATCH is set to LO to place the comparator circuit in the preset state to charge the comparator outputs to Vdd.

During the conversion phase, CMP is set to LO to enable the comparator to operate in the decision state, while LATCH alternates between a HI value as shown in period 8 and a LO value as shown in period 9 to switch the comparator between the decision state and the preset state. The HI LATCH values coincide with states of the conversion latches 44 of the ADC circuit in which voltages are applied to respective capacitors of the sampling capacitor bank 40 to produce input values for comparison as described previously. A LO latch value is provided between each input value to preset the voltages at the comparator outputs prior to receiving the next inputs. The number of LATCH pulses corresponds to the number of capacitors in the sampling capacitor bank 40. The resulting output values of the comparator comprise a binary word representing the value of the pixel signal. Either output OUTn, OUTp of the comparator may be used as the output signal for the ADC circuit.

Figure 9:
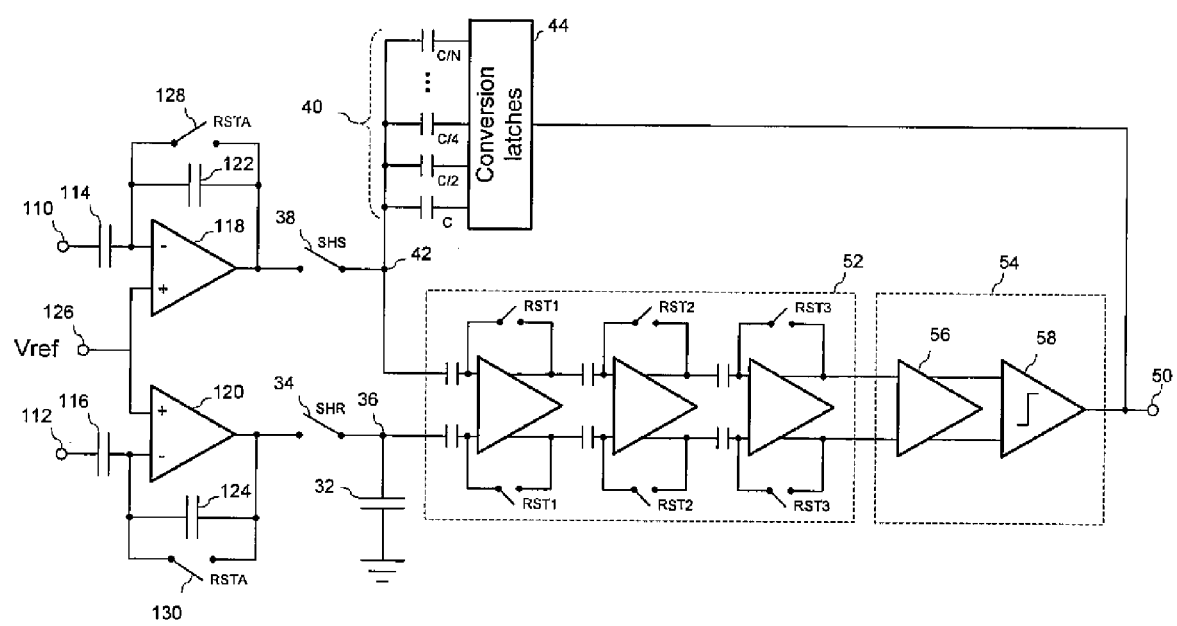
FIG. 9 shows details of a second ADC circuit capable of performing an offset reduction operation.

FIG. 9 shows an alternative ADC circuit that may be used for analog to digital conversion of pixel signals in a CMOS image sensor. The ADC circuit of FIG. 9 is configured for comparison of pixel signals with a reference value such as a dark signal value derived from a reference pixel or another reference signal. The circuit of FIG. 9 differs from the circuit of FIG. 3 with respect to its input stages, which include separate signal and reference input nodes 110, 112 that supply signals through respective input capacitors 114, 116 to respective amplifiers 118, 120. The amplifiers are configured as integrators using feedback capacitors 122, 124. A common reference voltage Vref is supplied to inputs of the amplifiers through a common input node 126. Reset switches 128, 130 controlled by a common reset control signal RSTA are provided to reset the output values of the amplifiers.

Figure 10:
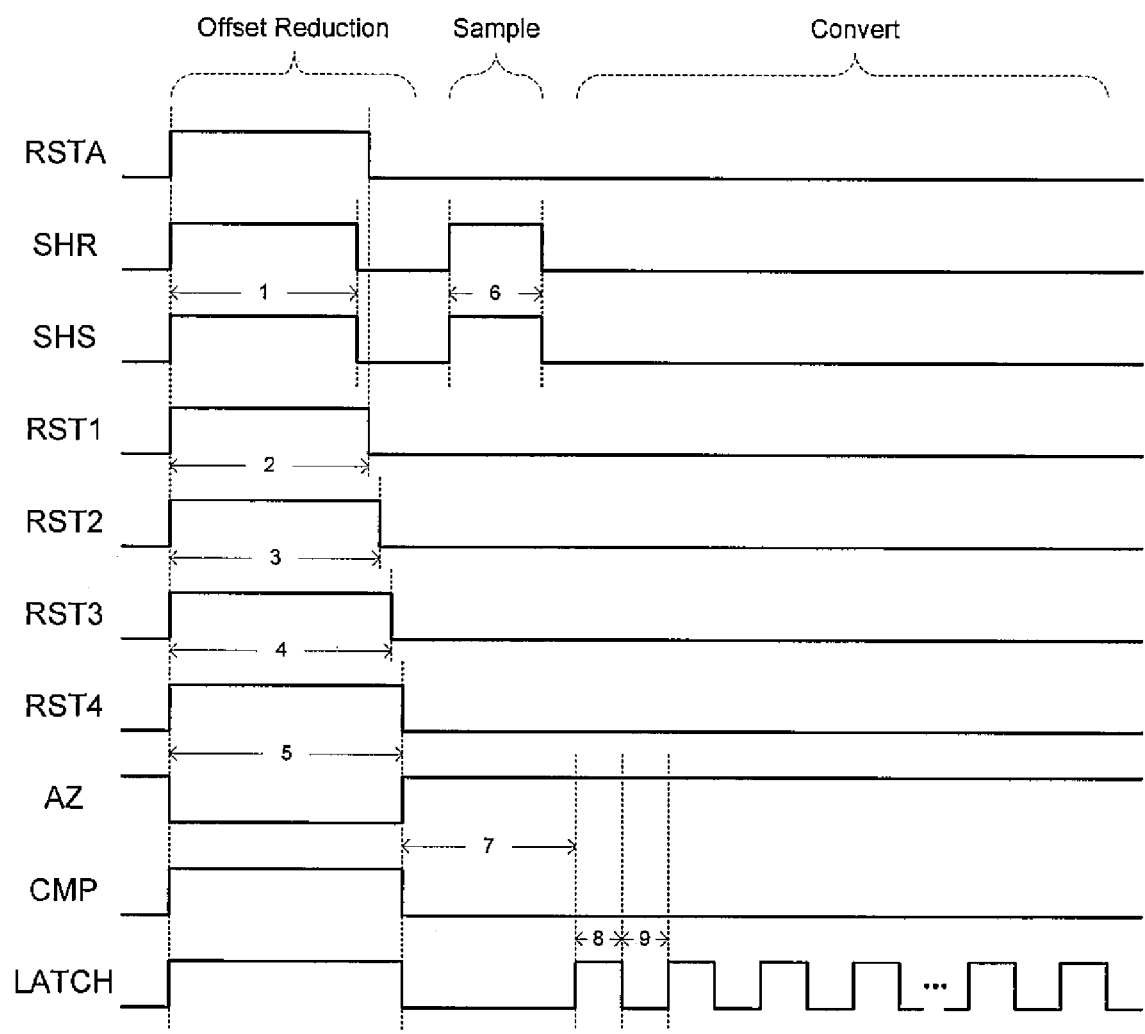
FIG. 10 shows a timing diagram for the circuit of FIG. 9.

FIG. 10 provides a timing diagram for control signals provided by a controller to the ADC circuit of FIG. 9. The timing diagram of FIG. 10 differs from the timing diagram of FIG. 8 in that it includes an input amplifier reset signal RSTA that is enabled during the autozeroing phase for a period 2 that slightly exceeds the period 1 during which the switches 34, 38 are enabled to supply respective reset signals received at the inputs 110, 112 to the input nodes 36, 42. Additionally, the timing diagram of FIG. 10 shows that the SHS and SHR signals enable simultaneous sampling of a pixel signal and a reference pixel signal onto respective input nodes 42, 36 during period 7.

While it is preferable to use an autozeroing amplifier section 52 in combination with an autozeroing comparator section 54 as shown in FIGS. 3 and 9, alternative embodiments may employ one or the other of these sections circuits to enable an offset reduction operation in an ADC circuit so as to provide more uniform performance among ADCs. For example, an alternative ADC circuit may use an autozeroing amplifier section 52 in combination with a conventional comparator that does not have the capability to perform an offset reduction operation, such as the comparator 38 of the conventional ADC circuit. Another alternative ADC circuit may use an autozeroing comparator section 54 without a preceding autozeroing amplifier section 52. Alternatively, an autozeroing comparator section 54 may be used in combination with an amplifier section that provides amplification of the input signals to reduce the effect of comparator offset but does not have the ability to perform its own offset reduction operation. The controller operation and control signals for these alternative circuits may be derived from the timing diagrams of FIGS. 8 and 10 by eliminating the control signals associated with the eliminated circuit elements. In embodiments using an autozeroing amplifier section, the amplifier section may include a single or multiple amplifier stages. Further, while it is preferable to employ a buffer 56 in an autozeroing comparator section 54 as shown in FIGS. 3 and 9, the buffer 56 may be eliminated in alternative embodiments. Further alternative embodiments may include other circuits in the autozeroing amplifier section 52 or autozeroing comparator section 54 such as additional amplifier stages or buffers.

The ADC circuits described herein may be implemented in a variety of devices. In general terms, the ADC circuits described herein may be implemented to provide analog to digital conversion of a signal in a manner that substantially reduces circuit-specific offset that can influence comparator operation and lead to different conversion decisions by different ADC circuits operating on equivalent input signals. The ADC circuits described herein are particularly suited for use in CMOS image sensors where consistent column-to-column ADC operation is desirable to reduce artifacts in the sampled image. The ADC circuits may be implemented in various configurations, such as configurations having a separate ADC circuit for each column of the pixel array, or having a single ADC for multiple columns of the pixel array. However applications of these circuits is not limited to image sensors.

While the circuits illustrated herein are implemented using particular combinations of NMOS and PMOS transistors, those circuits are provided by way of example only. The same analog signal processing and logical functions may be achieved using other combinations of MOS transistors or other types of transistors. Other components may also be added to the illustrated circuits. For example, cascode amplifiers may be substituted for the source followers in the circuit of FIG. 7. Further, while the embodiments described herein assume a control sequence in which reset signals are supplied prior to pixel signals, alternative embodiments may be implemented to receive pixel signals prior to reset signals.

The circuits, devices, features and processes described herein are not exclusive of other circuits, devices, features and processes, and variations and additions may be implemented in accordance with the particular objectives to be achieved. For example, circuits as described herein may be integrated with other circuits not described herein to provide further combinations of features, to operate concurrently within the same devices, or to serve other types of purposes. The embodiments illustrated in the figures and described in the preceding text are offered as examples of implementations that include features specified in the various claims that follow. The inventions are not limited to those particular embodiments, but rather extend to various modifications and combinations that fall within the scope of the following claims and their equivalents.

The invention claimed is:

1. A circuit, comprising:
   a comparator comprising a plurality of input nodes; and
   a circuit component connected to at least one of the plurality of input nodes of the comparator;
   said comparator configured to perform an offset reduction operation to compensate for offset between the plurality of input nodes; and
   said comparator configured to perform a decision operation using positive feedback to decide which of the plurality of input nodes is being provided with a highest input voltage.

2. The circuit of claim 1,
   said comparator further comprising a plurality of output nodes; and
   said comparator configured to perform a preset operation in which a potential from a voltage source is applied to the plurality of output nodes.

3. The circuit of claim 2, said comparator further comprising:
   two PMOS preset transistors, each PMOS preset transistor of the two PMOS preset transistors coupled between a corresponding output node of the plurality of output nodes and the voltage source.

4. The circuit of claim 3,
   wherein, during said preset operation, a latch control signal with a LO level is applied to a gate of each of the two PMOS preset transistors.

5. The circuit of claim 1, said comparator further comprising:
   a plurality of output nodes;
   two NMOS reset transistors, each NMOS reset transistor coupled between a respective output node of the plurality of output nodes and a corresponding input node of the plurality of input nodes;
   two PMOS load transistors, each of the two PMOS load transistors coupled between a corresponding output node of the plurality of output nodes and a voltage source; and
   two PMOS autozero enable transistors, a gate of each PMOS load transistor of the two PMOS load transistors coupled to a drain of the PMOS load transistor through a respective PMOS autozero enable transistor of the two PMOS autozero enable transistors.

6. The circuit of claim 5,
   wherein, during said offset reduction operation, an autozero control signal with a LO level is applied to a gate of each of the two PMOS autozero enable transistors and a reset signal is applied to a gate of each of the two NMOS reset transistors.

7. The circuit of claim 1, said comparator further comprising:
   a first output node;
   a second output node;
   a first PMOS load transistor coupled between a voltage source and the first output node;
   a second PMOS load transistor coupled between the voltage source and the second output node;
   a first PMOS comparator enable transistor coupled between the first output node and a gate of the second PMOS load transistor; and
   a second PMOS comparator enable transistor coupled between the second output node and a gate of the first PMOS load transistor.

8. The circuit of claim 7,
   wherein, during said decision operation, a comparator control signal with a LO level is applied to a gate of the first PMOS comparator enable transistor and to a gate of the second PMOS comparator enable transistor.

9. The circuit of claim 1,
   wherein the circuit is an analog to digital converter circuit.

10. The circuit of claim 1, said circuit component comprising a buffer.

11. The circuit of claim 1, said circuit component comprising an amplifier.

12. The circuit of claim 1, said circuit component comprising at least one of a transistor and a capacitor.

13. A method, comprising:
    performing, by a comparator having a plurality of input nodes, an offset reduction operation to compensate for offset between the plurality of input nodes; and
    performing, by the comparator, a decision operation using positive feedback to decide which of the plurality of input nodes is being provided with a highest input voltage.

14. The method of claim 13, further comprising:
    performing, by the comparator, a preset operation in which a potential from a voltage source is applied to a plurality of output nodes of the comparator.

15. The method of claim 14, said performing, by the comparator, the preset operation, comprising:
    causing the plurality of output nodes to be charged to a particular voltage level.

16. The method of claim 14,
    wherein the offset reduction operation is performed before the preset operation is performed; and
    wherein the preset operation is performed before the decision operation is performed.

17. The method of claim 14, said performing, by the comparator having the plurality of input nodes, the offset reduction operation, comprising:
    enabling a current to flow between each input node of the plurality of input nodes and a corresponding output node of the plurality of output nodes.

18. The method of claim 14, said performing, by the comparator, the decision operation using positive feedback, comprising:
    controlling current flow from the voltage source to each output node of the plurality of output nodes based on a value at a corresponding opposing output node of the plurality of output nodes.

19. A circuit, comprising:
    comparator means for performing an offset reduction operation to compensate for offset between a plurality of input nodes of the comparator means, and for performing a decision operation using positive feedback to decide which of the plurality of input nodes is being provided with a highest input voltage; and
    a circuit component connected to at least one of the plurality of input nodes of the comparator means.

20. The circuit of claim 19,
    said comparator means for performing a preset operation in which a potential from a voltage source is applied to a plurality of output nodes of the comparator means.

21. The circuit of claim 20,
    said comparator means including preset means for causing the plurality of output nodes to be charged to a particular voltage level during the preset operation.

22. The circuit of claim 20,
said comparator means including reset means for enabling a current to flow between each input node of the plurality of input nodes and a corresponding output node of the plurality of output nodes during the offset reduction operation.

23. The circuit of claim 20,
said comparator means including comparator enable means for controlling current flow from the voltage source to each output node of the plurality of output nodes based on a value at a corresponding opposing output node of the plurality of output nodes during the decision operation.

24. The circuit of claim 19, said circuit component comprising a buffer.

25. The circuit of claim 19, said circuit component comprising a transistor.

* * * * *